(12) United States Patent
Pitzer et al.

(10) Patent No.: US 6,876,710 B1
(45) Date of Patent: Apr. 5, 2005

(54) DIGITALLY CONTROLLED CIRCUIT FOR REDUCING THE PHASE MODULATION OF A SIGNAL

(75) Inventors: Armin Pitzer, Krefeld (DE); Torsten Hinz, Neuss (DE)

(73) Assignee: Infineon Technologies AG, Munich (DE)

( * ) Notice: Subject to any disclaimer, the term of this patent is extended or adjusted under 35 U.S.C. 154(b) by 784 days.

(21) Appl. No.: 09/619,973

(22) Filed: Jul. 20, 2000

Related U.S. Application Data (63) Continuation of application No. PCT/DE99/00095, filed on Jan. 18, 1999.

(51) Int. Cl.$^7$ .............................................. H04L 25/00
(52) U.S. Cl. ........................ 375/371; 375/376; 375/371; 375/149; 375/372; 332/103; 332/127
(58) Field of Search ................................. 375/371, 372, 375/376; 331/1, 18; 327/105; 332/103, 127

(56) References Cited

U.S. PATENT DOCUMENTS

| | | | |
|---|---|---|---|
| 5,493,243 A | | 2/1996 | Ghoshal |
| 5,502,750 A | * | 3/1996 | Co et al. ..................... 375/372 |
| 5,534,827 A | * | 7/1996 | Yamaji ........................ 332/103 |
| 5,602,882 A | | 2/1997 | Co et al. |
| 5,834,987 A | * | 11/1998 | Dent ............................ 332/127 |

FOREIGN PATENT DOCUMENTS

| | | |
|---|---|---|
| DE | 39 42 883 A1 | 6/1991 |
| EP | 0 692 878 A2 | 1/1996 |

OTHER PUBLICATIONS

Published International Application No. WO 96/28889 (Wilson et al.), dated Sep. 19, 1996.

* cited by examiner

Primary Examiner—Shuwang Liu
Assistant Examiner—Eva Zheng
(74) Attorney, Agent, or Firm—Laurence A. Greenberg; Werner H. Stemer; Gregory L. Mayback (57) ABSTRACT

A digitally controlled circuit for reducing the phase modulation of a signal. The circuit has a multiphase clock generator that produces n phases of a clock that is m-times the signal. The circuit further has a multiplexer with n inputs for the n phases of the clock and with one output which supplies the output signal. The output signal and the signal are connected to the inputs of a phase comparator. The output signal of the comparator is supplied to a sigma-delta modulator whose output signals are used for controlling the multiplexer. A jittered input signal is compared in the phase comparator with a master clock. The determined phase difference is integrated in a sigma-delta modulator. The aim of the circuit is to generate a clock without jitter, digitally and without using external components. This circuit provides 20 dB/decade attenuation of the jitter received in the SYNC signal, based on the P-regulator characteristic.

9 Claims, 4 Drawing Sheets

DIGITALLY CONTROLLED CIRCUIT FOR REDUCING THE PHASE MODULATION OF A SIGNAL

CROSS-REFERENCE TO RELATED APPLICATION

This is a continuation of International Application PCT/DE99/00095, filed Jan. 18, 1999, which designated the United States.

BACKGROUND OF THE INVENTION

Field of the Invention

The present invention relates to a digitally controlled circuit for reducing phase modulation (jitter) of a signal. The present circuit allows clock-rate conversion to be carried out at the same time.

The phase modulation of a signal is normally referred to as "jitter" in the specialist terminology. The jitter is generally sinusoidal and is defined by a jitter frequency and a jitter amplitude.

As far as possible, digital signal processing attempts to manage jitter control without using any analog components. In particular, the aim is to be able to form the circuits completely in an integrated circuit, without any external components. Circuits for reducing the phase modulation (jitter attenuators) according to the prior art normally require external components. This results in additional technological and temperature relationships, and non-linearities in the external components. At the same time, more space is consumed on the board, and higher costs are incurred. The known jitter attenuators still include analog circuits. This results in further technology relationships, non-linearities in the jitter attenuation response and, in some circumstances, resonance problems as well.

Digital jitter attenuators are, admittedly, already known, for example from U.S. Pat. No. 5,493,243. However, these have relatively high intrinsic jitter, that is to say system-immanent phase modulation. The known jitter attenuators furthermore have a correction interval that is dependent on the phase difference, and the phase difference is neither detected nor evaluated continuously in time.

U.S. Pat. Nos. 5,502,750 and 5,602,882 have both disclosed a jitter attenuator for a received signal. In this case, an up/down counter is disposed downstream of the phase comparator.

SUMMARY OF THE INVENTION

It is accordingly an object of the invention to provide a digitally controlled circuit for reducing the phase modulation of a signal that overcomes the above-mentioned disadvantages of the prior art devices of this general type, which generates a clock that is free of phase modulation (which has no jitter) digitally and without using any external components, and which can follow a dynamic change in the frequency precisely.

With the foregoing and other objects in view there is provided, in accordance with the invention, a digitally controlled circuit for reducing a phase modulation of a given signal. The digitally controlled circuit contains a multiphase clock generator producing n phases of a clock being m-times the given signal. A multiplexer is connected to the multiphase clock generator and has n inputs for receiving the n phases of the clock. The multiplexer has one output supplying an output signal. A phase comparator has inputs receiving the output signal of the multiplexer and the given signal, and generates a compared output signal. Finally, a sigma-delta modulator is connected to the phase comparator and receives the compared output signal. The sigma-delta modulator generates correction commands used for controlling the multiplexer.

In accordance with an added feature of the invention, m is equal to four and n is equal to four.

According to the invention, the object is achieved by a multiphase clock generator which produces n phases of a clock which is m-times the jittered signal, and by a multiplexer with n inputs for the n phases of the clock and with one output which supplies the output signal. The output signal and the jittered signal are connected to the inputs of a phase comparator whose output signal is supplied to a sigma-delta modulator whose output signals are used for controlling the multiplexer. In principle, sigma-delta modulators are known. However, in the past, such modulators have been used in the prior art only for recovering non-integer fractions of frequencies. The principle of sigma-delta modulators is based on phase-error accumulation. The phase error between the basic clock cycle and the clock required by the control system is recalculated and at the same time evaluated in each basic clock cycle.

In order to allow even relatively large phase differences to be processed, it is preferable for a phase-difference accumulator and a phase-difference transformer to be disposed between the phase comparator and the sigma-delta modulator. Provided the ratio between the master clock and the jittered signal is not an integer, the jittered signal is supplied to the appropriate input of the phase comparator via a further sigma-delta modulator for clock-rate conversion.

In this case, in order to reduce the power consumption and the speed requirements for the components of the phase-difference accumulator, the phase-difference transformer and the sigma-delta modulator, it is preferable for the output signal to be reduced via a divider circuit, and for the reduced output signal to be supplied to the phase-difference accumulator and to the sigma-delta modulator. The output signals of the sigma-delta modulator are supplied to the multiplexer and to the divider circuit via an edge recognition circuit, with the edge recognition circuit being actuated by the master clock output signal.

In this case, it is particularly preferable for the division ratio of the divider circuit to correspond to the ratio of the output signal to the jittered signal, if appropriate after the clock-rate conversion by the further sigma-delta modulator.

The sigma-delta modulator for suppressing the phase modulation may, in a particularly advantageous and simple manner, be in the form of a binary adder that adds the values coming from the phase comparator. The overflow and underflow outputs of the adder can then be used directly for producing the correction commands.

The phase-difference accumulator preferably has a circuit for recognizing an overflow or underflow in the phase detector, the output of which circuit is connected to a counter that counts upward for any overflow and downward for any underflow.

Other features which are considered as characteristic for the invention are set forth in the appended claims.

Although the invention is illustrated and described herein as embodied in a digitally controlled circuit for reducing the phase modulation of a signal, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

In all the figures of the drawing, sub-features and integral parts that correspond to one another bear the same reference symbol in each case. Referring now to the figures of the drawing in detail and first, particularly, to FIG. 1 thereof, there is shown an outline block diagram of a digitally controlled circuit according to the invention for reducing phase modulation of a signal, including a clock-rate conversion using a sigma-delta modulator. A jittered input signal SYNC is in this case compared with a master clock MCLK. The latter at the same time represents the output signal of the circuit. A determined phase difference is integrated in a sigma-delta modulator. The principle of sigma-delta modulators is based on phase-error accumulation. A phase error between the MCLK and the MCLK required by the control system is recalculated and at the same time evaluated in each basic clock cycle. The aim is thus to generate the clock MCLK which has no jitter, digitally and without using any external components, such a clock being required for E1/T1-applications in the frequency range from 2.048 to 1.544 MHz, or multiples of this.

Figure 1:
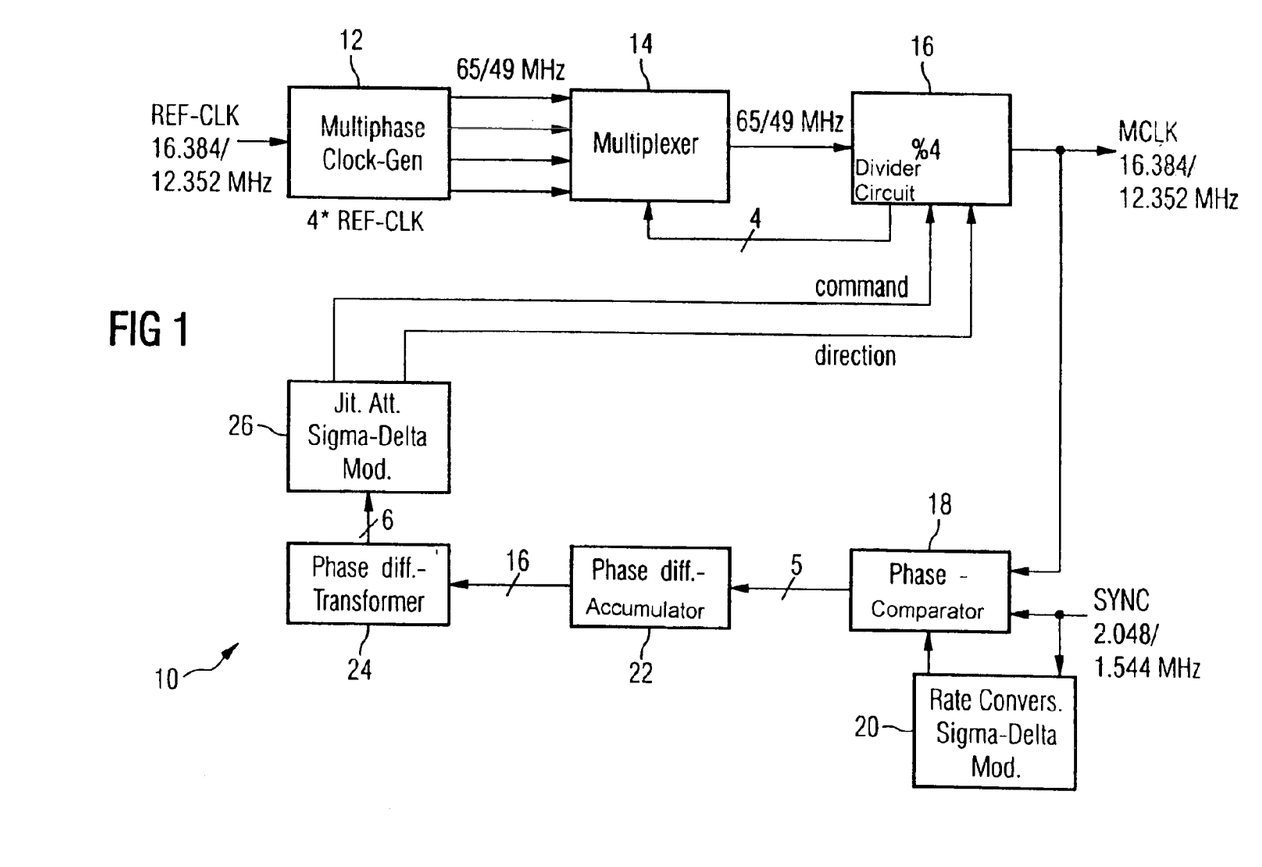
FIG. 1 is a block diagram of a circuit according to the invention.

A circuit 10 is supplied with a reference clock REF-CLK, whose phase with respect to the input signal SYNC is random, or else fluctuates randomly. In the present exemplary embodiment, the reference clock frequency may be 16.384 or 12.352 MHz. The reference clock is supplied to a multiphase clock generator 12, which is in the form of a ring oscillator. This produces four times the frequency (4×REF-Clock) at four phase angles, each at 90° to one another. At an output of the multiphase clock generator 12, there are thus four clock signals at 65 or 49 MHz, each separated from one another by a phase angle of 90°. The four signals are supplied to a multiplexer 14, which selects one of the signals and supplies this to a divider circuit 16. The divider circuit 16 reduces the clock rate by a factor of 4, while at the same time controlling the time at which selection signals are passed on to the multiplexer 14. The configuration and operation of the divider circuit 16 will be described in detail further below.

The output signal MCLK is supplied to a phase comparator 18. The phase comparator 18 has a further input, to which the jittered input signal SYNC is applied. If a frequency of the input signal SYNC is not one eighth of the frequency MCLK, the input signal SYNC is supplied to a sigma-delta modulator 20, which is used to match the frequency of the input signal SYNC to ⅛ of the frequency MCLK. The operation of the sigma-delta modulator 20 will be explained in detail further below.

The phase comparator 18 determines the phase difference between the master clock MCLK and the SYNC clock, which has a greater or lesser amount of jitter. The phase difference is resolved in 2π/8 steps, that is to say in 45° steps over 360°. The SYNC clock is at the same time synchronized, on the input side, to the MCLK clock. The absence of the SYNC clock can be detected using a counter. In this case, the stored phase difference is deleted.

The core of the phase comparator 18 is a 5-bit counter, which is decremented in each MCLK clock cycle. Whenever a SYNC edge is detected, 8 is added to the current count, and the result is stored in a buffer. The buffer value, which is in 2's complement form, represents the phase error in steps of 2π/8. The maximum phase difference magnitude which can be stored is thus 16*2π/8=4π.

The phase error that is actually present is, however, considerably greater in practice and errors of up to +/−280π may occur. This is always based on a sinusoidal jitter waveform, without any sudden changes. The detection range for the phase error therefore has to be increased. This is done by connecting a phase-difference accumulator 22 downstream of the phase comparator 18. The 5-bit phase difference from the phase comparator 18 is supplied to the input of the phase-difference accumulator 22 (see FIG. 2). The 5-bit value of the phase difference from the phase comparator 18 is in each case compared with the previous difference in the phase-difference accumulator 22. If an overflow (change from 11111 to 00000) is detected, an 11-bit counter 206 is incremented by 1, and in the event of an underflow (change from 00000 to 11111) the counter 206 is decremented. An overflow and underflow test on the 11-bit counter 206 is carried out at the same time. When an overflow or underflow occurs in the 11-bit counter 206, the addition or subtraction, respectively, is suspended. The 11-bit count of the phase-difference accumulator 22 and the 5-bit phase difference from the phase comparator 18 are stored as a 16-bit value in the phase-difference accumulator 22, and are available at the output of the phase-difference accumulator 22.

Figure 2:
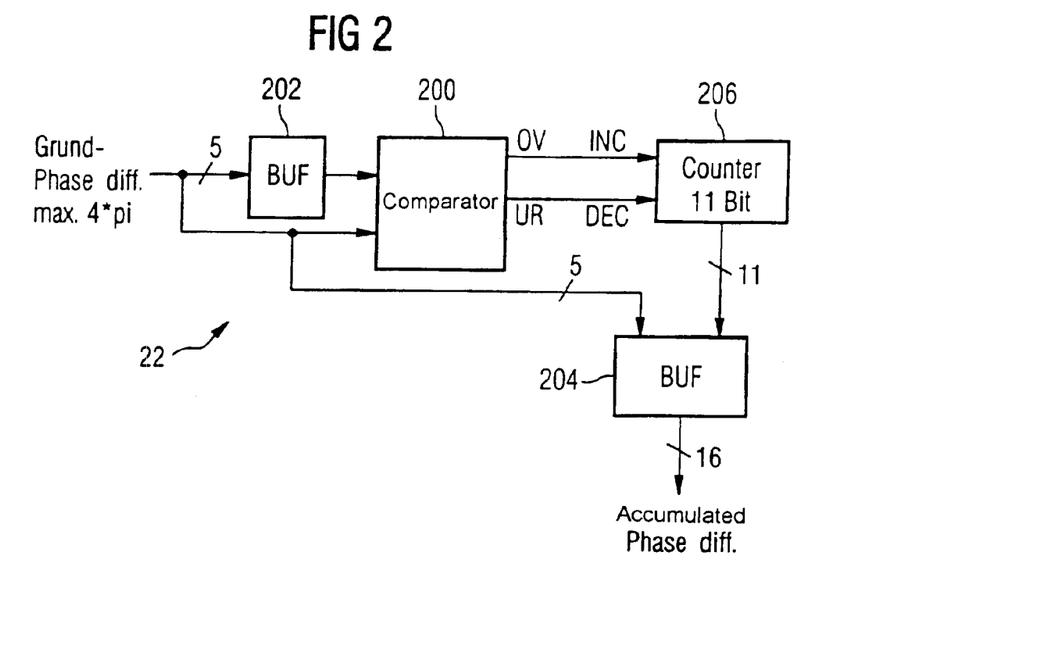
FIG. 2 is a block diagram of a phase-difference accumulator in the present circuit.

The circuitry of the phase-difference accumulator 22 is shown in detail in FIG. 2. The 5-bit basic phase difference (corresponding to a maximum of 4 pi) is supplied from the phase comparator 18 to a comparator 200, first directly and second via a buffer 202. At the same time, the basic phase difference is supplied to the 5 least-significant bits of an output buffer 204 with an overall word length of 16 bits.

The comparator 200 has two outputs, overflow (OV) and underflow (UR). These two outputs are connected to increment (INC) and decrement (DEC) inputs of the 11-bit counter 206. The count of the counter 206 is transferred to the 11 most-significant bits of the output buffer 204. The accumulated phase difference is thus present, with a word length of 16 bits, at the output of an output buffer 204 of the phase-difference accumulator 22. The 16-bit output value from the phase-difference accumulator 22 is supplied to a phase-difference transformer 24. The phase-difference transformer uses the expanded phase difference (16 bits, 2's complement) to determine the input magnitude for a further sigma-delta modulator 26. The phase-difference transformer 24 is used here since the sigma-delta modulator 26 processes only an input signal with a length of 6 bits. Apart from this, it is used to adjust the regulator characteristic of the circuit.

In this case, the phase difference is transformed in frequency modification steps (ppm) with 6 bits, in 2's complement form. To this end, the phase difference is first of all divided by a programmable value from 2 to 256. This operation allows the cut-off frequency of the P-regulator to be varied. The circuit according to the invention can thus be adjusted to satisfy different system requirements or standards. The phase difference is then reduced to 6 bits. To this end, the six least-significant bits of the modified phase difference are passed on without being changed to the sigma-delta modulator as long as the value of the overall phase difference is less than +31 and greater than −32. If not, the correction value for the sigma-delta modulator 26 is limited to +31 or −32, respectively.

Figure 3:
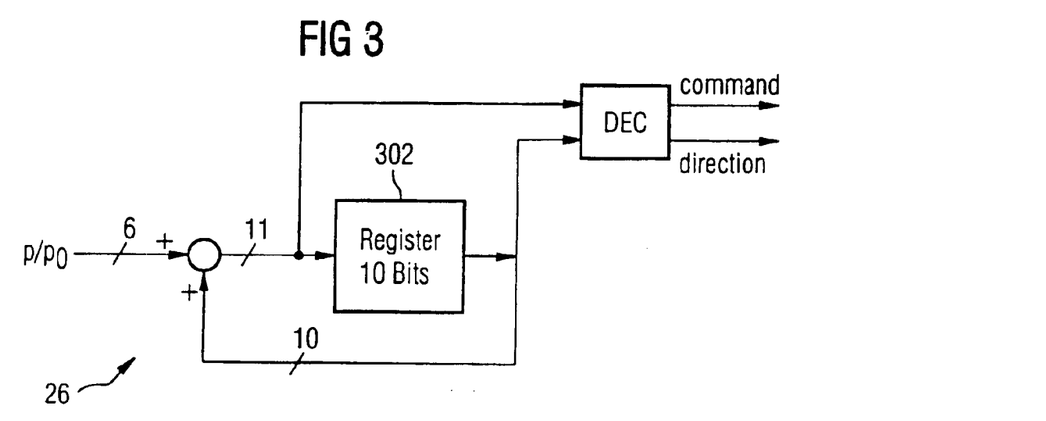
FIG. 3 is a block diagram of a sigma-delta modulator for phase-modulation attenuation.

The sigma-delta modulator 26 controls the actual phase-modulation attenuation. Specifically, it determines the control variable for the modification of the REF-CLK at 16.384 or 12.352 MHz. FIG. 3 shows the configuration of the sigma-delta modulator 26. A 10-bit register 302 controls the phase difference between the actual MCLK and the MCLK configured by the control system. The value that is added to the contents of the register 302, or is subtracted from it, in each clock cycle is directly proportional to the phase error between the MCLK and the MCLK desired by the control system. If the total phase error that has occurred is large enough, the sigma-delta modulator 26 initiates a clock correction. The indicator for this is a register overflow.

In the embodiment of the invention described here, the divider 16 and the multiplexer 14 may lengthen or shorten one period of the REF-CLK clock cycle by 1/16 of a clock cycle. This corresponds to 1/16 of 1/16.384 MHz=61.04 ns/16= 3.81 ns, or 1/16 of 12.352 MHz=5.06 ns. The 10-bit size chosen for the register 302 allows a phase error of 1024 to be added up is before an overflow occurs. Therefore, a phase error of 1 in the register 302 corresponds to a real phase error between the clock MCLK and the desired MCLK of 3.81 ns/1,024=3.73 Ps. The desired frequency can be adjusted using the input value to the accumulator: the greater the value, the greater the phase error per clock cycle between the desired MCLK and the real MCLK, and thus the greater the accumulator overflow, and thus the more frequently a clock correction is made.

The advantage of using the sigma-delta modulator is that, when a dynamic change occurs in the frequency desired by the control system, this is immediately reflected in the phase accumulation. The previous total phase difference between the real MCLK and the desired MCLK is not deleted, but is linked directly to the correction actuation.

The sigma-delta modulator 26 that is used is, in one particular preferred embodiment, is in the form of a binary adder. The value at the input and coming from the phase-difference transformer 24 is added in each clock cycle. The correction command and the correction direction are decoded from the overflow or underflow of the register 302, and are passed on to the divider 16. If a division factor of 2 is chosen in the phase-difference transformer 24, this results in the proportional factor for the control system becoming 7.6 ppm frequency change per 2π/4 phase error between the MCLK and SYNC. This gives the following table:

| Phase error in time units in the E1 mode | Accu |
|---|---|
| −3.8 ns/2 | 0 |
| 0 ns | 511 |
| +3.8 ns/2 | 1023 |

(minimum correction unit=3.8 ns in E1/5.06 ns in T1).

The divider 16 and the multiplexer 14 are controlled as a function of the COMMAND and DIRECTION control commands produced by the sigma-delta modulator 26, such that an output signal MCLK which is synchronized to the input signal SYNC is present at the output.

The multiplexer 14 passes on one of the four 65/49 MHz clock phases. The divider 16 divides the 65/49 MHz clock by 4, and determines the required 65/49 MHz clock phase as a function of the output magnitudes on the sigma-delta modulator 26. The process of passing on from one clock phase to the next results in shortening or lengthening by in each case 4*65,536 MHz=262.144 MHz corresponding to 3.8 ns or, respectively, 4*49.408 MHz=197.632 MHz, corresponding to 5.06 ns in T1.

The output signal of the divider 16 is a 16.384/12.352 MHz clock (MCLK) which is shortened or lengthened relative to the previous clock period, or else is the same as it. The intrinsic jitter is only 0.0078 UI.

Figure 5:
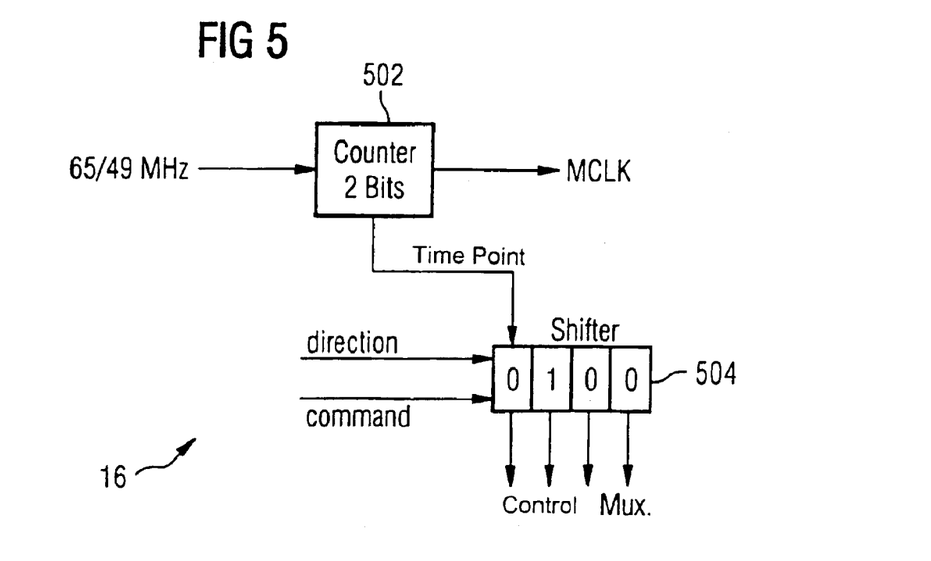
FIG. 5 is a block diagram of a divider and multiplexer actuation circuit.

FIG. 5 shows the configuration of the divider 16, once again, in detail. The 65/49 MHz signal that comes from the multiplexer is supplied to a 2-bit counter 502. Its MSB supplies the signal MCLK and at the same time the time at which a shift register 504 is enabled. The shift register has four digits and always contains one 1, and only zeros apart from this. The four outputs of the shift register are used for controlling the multiplexer 14, in which the only phase which is in each case passed on from the multiphase clock generator 12 by the multiplexer 14 to the divider 16 is that whose associated location in the shift register is occupied by "1". The shift register is controlled via the DIRECTION and COMMAND commands from the signal-delta modulator 26.

The process is as now described. As soon as the "time" signal arrives from the counter 502 at the shift register 504, the DIRECTION and COMMAND inputs are enabled. Provided the COMMAND input is zero, the shift register 504 does not change. If the COMMAND input is active, the 1 is shifted by one digit to the left or right depending on the status of the DIRECTION input.

Figure 1A:
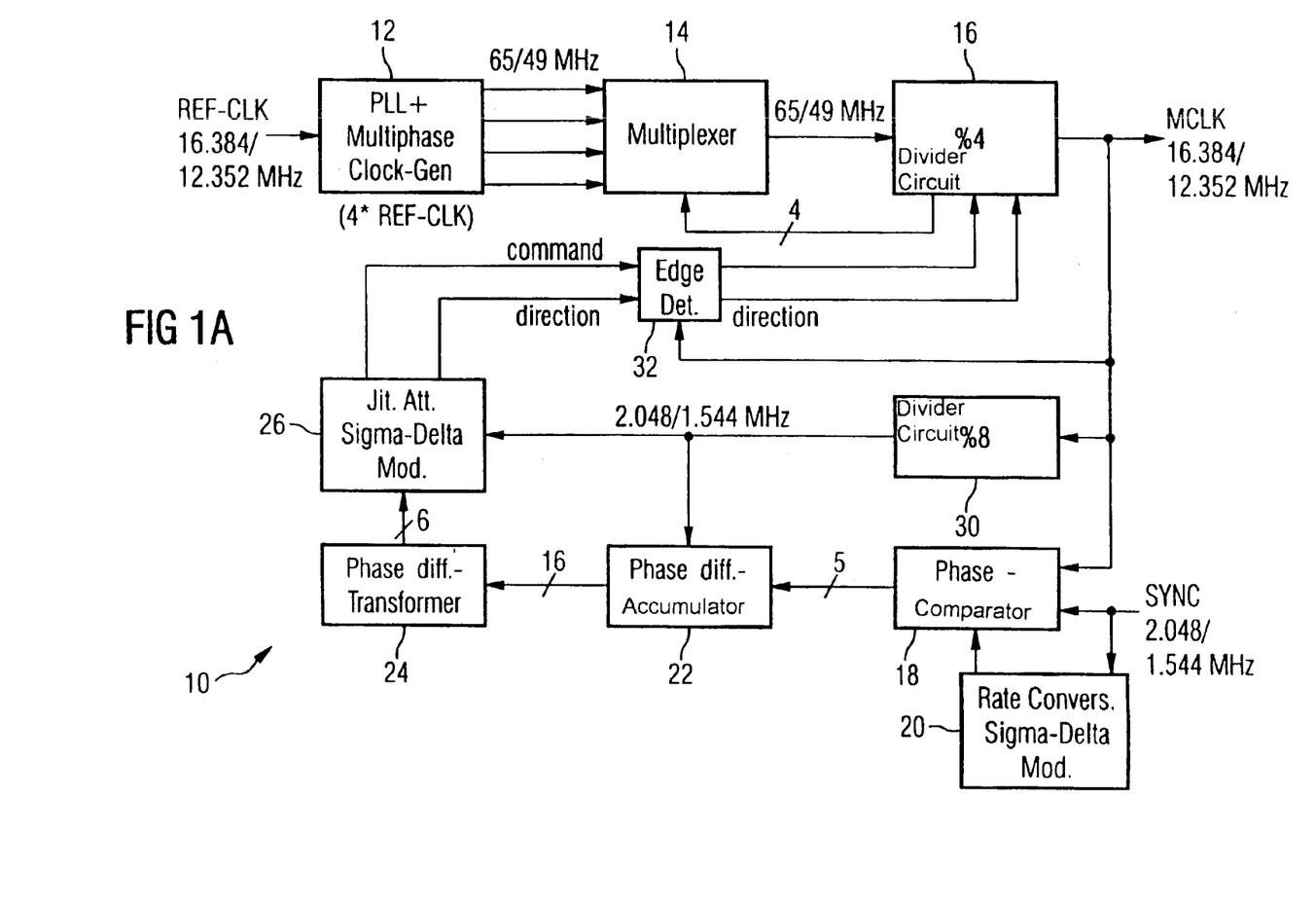
FIG. 1A is a block diagram of an enhanced version of the circuit diagram shown in FIG. 1.

FIG. 1A shows a detailed block diagram of the circuit according to the invention, in which the internal operating frequency is reduced in order to manage with a smaller number of high-speed components. To this end, the clock MCLK is divided by eight by a further divider 30, resulting in a clock at 2.048 or 1.544 MHz, respectively, instead of the MCLK clock of 16.384 or 12.352 MHz, respectively. The clock is then supplied as the in-use clock to the phase-difference accumulator 22 and to the sigma-delta modulator 26. The operating speed of the phase-difference transformer 24 is thus also automatically reduced to a corresponding extent. However, in this case, the output signals of the sigma-delta modulator 26 must be increased once again to the nominal frequency of 16.384 or 12.352 MHz, respectively, in order to actuate the divider 16. The COMMAND and DIRECTION signals are thus passed via an edge detector 32, which is connected between the sigma-delta modulator 26 and the divider 16, for matching to the clock MCLK. The edge detector is actuated by the signal MCLK.

The present circuit is intended to be used for circuits that comply with the E1/T1 Standards. The following constellations may therefore occur:

REF-CLK (internal in-use clock)=16.384 MHz, SYNC= 2.048 or 1.544 MHz;

REF-CLK=12.352 MHz, SYNC=2.048 or 1.544 MHz.

Figure 4:
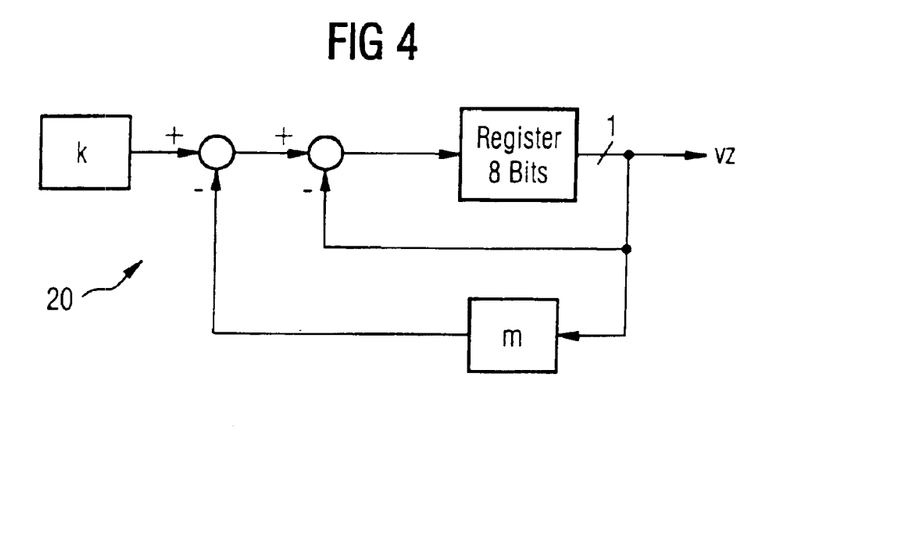
FIG. 4 is a block diagram of the sigma-delta modulator for clock-rate conversion.

In situations in which SYNC≠⅛ REF-CLK, the data rates must be converted from 2.048 Lo 1.544. MHz, or vice versa. To this end, the sigma-delta modulator 20 for the clock-rate conversion is connected between the input of the signal SYNC and the phase comparator 18 as is shown in FIGS. 1 and 1A. The configuration of the sigma-delta modulator is shown in more detail in FIG. 4. Clock-synchronous frequency division by a non-integer division factor in each case is thus required in this case.

This is achieved as follows:

1st conversion 2.048→1.544 MHz:

In this case, a frequency of 16.384 MHz is produced at REF clock. This corresponds to 8-times the frequency of 2.048 MHz. A 1.544 MHz clock is stipulated via SYNC. Thus: 16.384/1.544=10.611399. In order to achieve the non-integer division factor, the division factors 10 and 11 are chosen alternately. The "sign" VZ of the sigma-delta modulator is used to decide which divisor is used and when. The following values can be set for this situation in FIG. 4: m=21.5, k=96.5.

If the sigma-delta modulator register is negative, m+k=118 is added to the register, and in the positive situation m−k=−75 is added, that is to say 75 is subtracted. The frequency with which division by 11 must be carried out in order to achieve this non-integer division factor of 10.611399 is obtained from 118/(118+75); the frequency for the division factor of 10 is given by 75/(118+75). The overall division factor thus becomes:

$$11*118(118+75)+10*75(118+75)=10.611399.$$

Second, for the reverse conversion from 1.544→2.048 MHz: REF-CLK=12.352 MHz; SYNC=2.048 MHz. This thus results in 12.352/2.048=6.03125.

Division by 6 and 7 therefore has to be carried out alternately. To this end, the selections in this case are for m=−45 and k=48. Thus, when the register is negative, m+k=3 is added, otherwise m−k=−93 is added, that is to say 93 is subtracted.

In order to simplify the circuit further, the division is carried out indirectly in the phase comparator 18 in that the additional factor of 8, which is added to the accumulator when a SYNC flank is recognized, is replaced by the factors 10 and 11 or 6 and 7 for the clock-rate conversion. The sigma-delta modulator 20 thus selects only that figure which must in each case be added in the phase comparator 18.

If MCLK and SYNC are integer multiples, the sigma-delta modulator 20 does not operate, and 8 is always added in the phase comparator.

The embodiment of the invention described here results in the jitter received in the SYNC signal being attenuated at 20 dB/decade based on a P-regulator characteristic.

The invention thus allows the following advantages:

a. linear jitter attenuation;

b. a correction interval independent of the actual phase difference;

c. a phase difference being detected and evaluated continuously in time;

d. better dynamics than previous digital concepts;

e. greater accuracy in limit situations;

f. optimum jitter reduction response;

g. very low circuit-immanent (intrinsic) jitter;

h. no external components required;

i. no analog circuit required;

j. small space requirement on an IC (small silicon area);

k. low power consumption; and l. use of a low-cost frequency synthesizer possible.

We claim:

1. A digitally controlled circuit for reducing a phase modulation of a given signal, comprising:

a mutiphase clock generator producing n phases of a clock being m-times the given signal;

a multiplexer connected to said multiphase clock generator and having n inputs for receiving the n phases of the clock, said multiplexer having one output supplying an output signal;

a phase comparator having inputs receiving the output signal of said multiplexer and the given signal, and generating a compared output signal; and a sigma-delta modulator connected to said phase comparator and receiving said compared output signal, said sigma-delta modulator generating correction commands used for controlling said multiplexer.

2. A digitally controlled circuit for reducing a phase modulation of a given signal, comprising:

a multiphase clock generator producing n phases of a clock being m-times the given signal;

a multiplexer connected to said multiphase clock generator and having n inputs for receiving the n phases of the clock, said multiplexer having one output supplying an output signal;

a phase comparator having inputs receiving the output signal of said multiplexer and the given signal, and generating a compared output signal;

a sigma-delta modulator connected to said phase comparator and receiving said compared output signal, said sigma-delta modulator generating correction commands used for controlling said multiplexer; and a phase-difference accumulator and a phase-difference transformer interconnecting said phase comparator and said sigma-delta modulator.

3. A digitally controlled circuit for reducing a phase modulation of a given signal, comprising:

a multiphase clock generator producing n phases of a clock being m-times the given signal;

a multiplexer connected to said multiphase clock generator and having n inputs for receiving the n phases of the clock, said multiplexer having one output supplying an output signal;

a phase comparator having inputs receiving the output signal of said multiplexer and the given signal, and generating a compared output signal;

a sigma-delta modulator connected to said phase comparator and receiving said compared output signal, said sigma-delta modulator generating correction commands used for controlling said multiplexer; and a further sigma-delta modulator being connected to said phase comparator; and the given signal being supplied to an appropriate one of said inputs of said phase comparator through said further sigma-delta modulator for clock rate conversion.

4. The circuit according to claim 2, including an edge recognition circuit disposed between said multiplexer and said sigma-delta modulator, the correction commands of said sigma-delta modulator are supplied to said multiplexer through said edge recognition circuit, and said edge recognition circuit receives and is actuated by the output signal of said multiplexer.

5. The circuit according to claim 4, including a divider circuit disposed between said multiplexer and said sigma-delta modulator, said divider circuit receiving the output signal from said multiplexer and generates an output signal received by and actuating said phase-difference accumulator and said sigma-delta modulator.

6. The circuit according to claim 5, wherein said divider circuit has a division ratio corresponding to a ratio of the output signal to the given signal, if appropriate after a clock-rate conversion by said further sigma-delta modulator.

7. A digitally controlled circuit for reducing a phase modulation of a given signal, comprising:

a multiphase clock generator producing n phases of a clock being m-times the given signal;

a multiplexer connected to said multiphase clock generator and having n inputs for receiving the n phases of the clock, said multiplexer having one output supplying an output signal;

a phase comparator having inputs receiving the output signal of said multiplexer and the given signal, and generating a compared output signal; and a sigma-delta modulator connected to said phase comparator and receiving said compared output signal, said sigma-delta modulator generating correction commands used for controlling said multiplexer;

said sigma-delta modulator being a binary adder adding values coming from said phase comparator, and overflow and underflow outputs of said binary adder are used for producing the correction commands.

8. The circuit according to claim 2, wherein said phase-difference accumulator has a counter and a circuit for recognizing an overflow and an underflow of said phase comparator, said circuit has an output connected to said counter which counts upward for any overflow and downward for any underflow.

9. A digital circuit for reducing a phase modulation of a given signal, comprising:

a multiphase clock generator producing four phases of a clock being four-times the given signal;

a multiplexer connected to said multiphase clock generator and having n inputs for receiving the n phases of the clock, said multiplexer having one output supplying an output signal;

a phase comparator having inputs receiving the output signal of said multiplexer and the given signal, and generating a compared output signal; and a sigma-delta modulator connected to said phase comparator and receiving said compared output signal, said sigma-delta modulator generating correction commands used for controlling said multiplexer.

* * * * *

UNITED STATES PATENT AND TRADEMARK OFFICE
CERTIFICATE OF CORRECTION

PATENT NO. : 6,876,710 B1
DATED : April 5, 2005
INVENTOR(S) : Armin Pitzer et al.

It is certified that error appears in the above-identified patent and that said Letters Patent is hereby corrected as shown below:

<u>Title page,</u>
Item [30], Foreign Application Priority Data, should read
-- Jan. 20, 1998   (DE)   ................198 02 001 --

Signed and Sealed this

Fourteenth Day of June, 2005

JON W. DUDAS
*Director of the United States Patent and Trademark Office*